United States Patent
Wang et al.

(10) Patent No.: US 8,098,178 B2
(45) Date of Patent: Jan. 17, 2012

(54) CHIP AND SYSTEM UTILIZING THE SAME

(75) Inventors: Yi-Chiuan Wang, Taipei (TW);
Chin-Ling Hung, Changhua County (TW); Hong-Ching Chen, Kao-Hsiung County (TW)

(73) Assignee: Mediatek Inc., Hsin-Chu (TW)

( * ) Notice: Subject to any disclaimer, the term of this patent is extended or adjusted under 35 U.S.C. 154(b) by 922 days.

(21) Appl. No.: 12/117,817

(22) Filed: May 9, 2008

(65) Prior Publication Data
US 2009/0279636 A1 Nov. 12, 2009

(51) Int. Cl.
*H03M 1/10* (2006.01)

(52) U.S. Cl. .......................... 341/120; 341/61

(58) Field of Classification Search .............. 341/61, 341/120
See application file for complete search history.

(56) References Cited

U.S. PATENT DOCUMENTS

| | | | |
|---|---|---|---|
| 5,918,198 A * | 6/1999 | Ricca et al. | 702/110 |
| 6,658,368 B2 * | 12/2003 | Wagner et al. | 702/180 |
| 7,035,750 B2 * | 4/2006 | de Obaldia et al. | 702/117 |
| 7,327,153 B2 * | 2/2008 | Weinraub | 324/756.01 |
| 7,554,335 B2 * | 6/2009 | Han et al. | 324/537 |

* cited by examiner

*Primary Examiner* — Khai M Nguyen
(74) *Attorney, Agent, or Firm* — Thomas|Kayden

(57) ABSTRACT

A system including a pulse generating module and a processing module is disclosed. The pulse generating module generates a target signal. The processing module outputs a processing signal according to the target signal. Throughput of the target signal exceeds throughput of the processing signal.

20 Claims, 4 Drawing Sheets

CHIP AND SYSTEM UTILIZING THE SAME

BACKGROUND OF THE INVENTION

1. Field of the Invention

The invention relates to a chip, and more particularly to a chip for outputting a high speed signal.

2. Description of the Related Art

Integrated circuit (IC) technology plays an important role in the electronics industry. To reduce debug or test time, an external analyzer is used to observe an IC signal. The analyzer hardly observes a high-speed analog signal or a high-speed digital signal. For example, an engineer wishes to observe a high frequency 6-bit signal in an 18x DVD system, the speed of the signal transmitted to the analyzer is about 2.825 Gbps.

FIG. 1 is a conventional testing system. Conventional testing system 100 comprises a chip 110 and an analyzer 120. Chip 110 comprises a multiplexer 111, a digital to analog converter (DAC) 112, and a pad 113. Multiplexer 111 outputs one of target signals $S_{T1} \sim S_{Tn}$ according to a selection signal $S_{SEL}$. DAC 112 transforms the output signal of multiplexer 111 from a digital state to an analog state. Pad 113 transmits the transformed signal to analyzer 120.

Analyzer 120, via DAC 112, can read high-speed target signals $S_{T1} \sim S_{Tn}$. To match speed of the high-speed target signals $S_{T1} \sim S_{Tn}$, the processing speed of DAC 112 is also high, thus, the cost of testing system 100 is increased. Moreover, another disadvantage is that the original digital signal $S_{T1} \sim S_{Tn}$ will be distorted by the DAC 112.

FIG. 2 is another conventional testing system. Conventional testing system 200 comprises a chip 210 and an analyzer 220. Chip 210 comprises a multiplexer 211, a serial to parallel converter 222, and pads $P_1 \sim P_n$. Multiplexer 211 outputs one of target signals $S_{T1} \sim S_{Tn}$ according to a selection signal $S_{SEL}$. The serial to parallel converter 222 is used to corporate with the pads $P_1 \sim P_n$ with limit transmitting bandwidths and the target signals with very high throughput rate. Serial to parallel converter 222 transforms the target signals $S_{T1} \sim S_{Tn}$ from a serial state to a parallel state. Pads $P_1 \sim P_n$ outputs the transformed target signals to analyzer 220.

However, in the high-speed application, a synchronization issue occurs between pads $P_1 \sim P_n$. Additionally, in order to transmit high-speed signals, a large number of pads are required, and the cost of chip 210 is increased.

BRIEF SUMMARY OF THE INVENTION

Chips are provided. An exemplary embodiment of a chip comprises a pulse generating module and a compression unit. The pulse generating module generates a target signal. The compression unit compresses the target signal to generate a transforming signal. Throughput of the target signal exceeds throughput of the transforming signal.

Systems utilizing chips are also provided. An exemplary embodiment of a system comprises a pulse generating module and a processing module. The pulse generating module generates a target signal. The processing module outputs a processing signal according to the target signal. Throughput of the target signal exceeds throughput of the processing signal.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
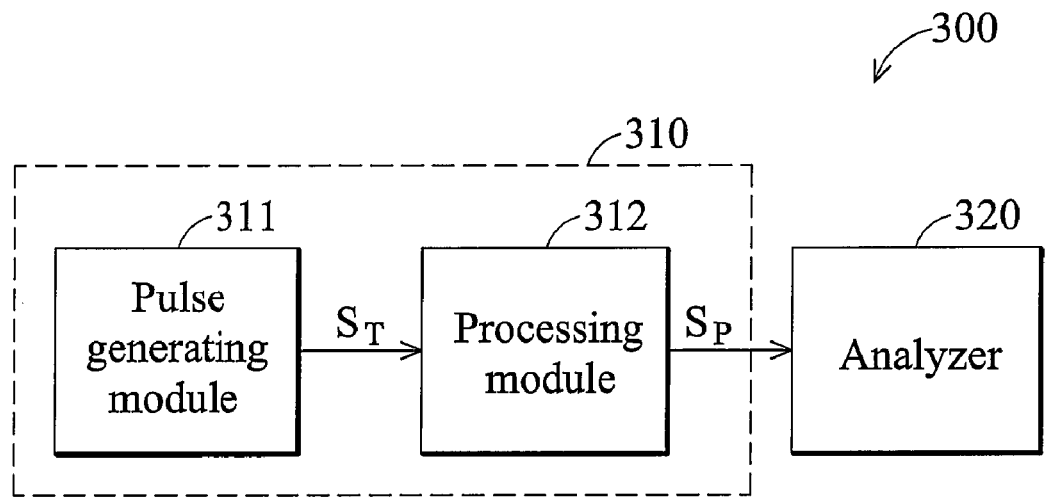
FIG. 3 is a schematic diagram of an exemplary embodiment of a system.

FIG. 3 is a schematic diagram of an exemplary embodiment of a system. System 300 comprises a chip 310 and an analyzer 320. Chip 310 comprises a pulse generating module 311 and a processing module 312. Analyzer 320 is an oscilloscope or a display device for analyzing a signal output from processing module 312. An engineer debugs or tests chip 310 according to a signal received by analyzer 320 to determine whether the chip 310 is abnormal.

Pulse generating module 311 generates a target signal $S_T$. Target signal $S_T$, for example, can be a high-speed signal, a radio frequency (RF) signal, a signal generated by an analog to digital converter (ADC), or a signal that is not processed by a de-modulation device. In some embodiments, pulse generating module 311 comprises an ADC for generating target signal $S_T$.

Figure 1:
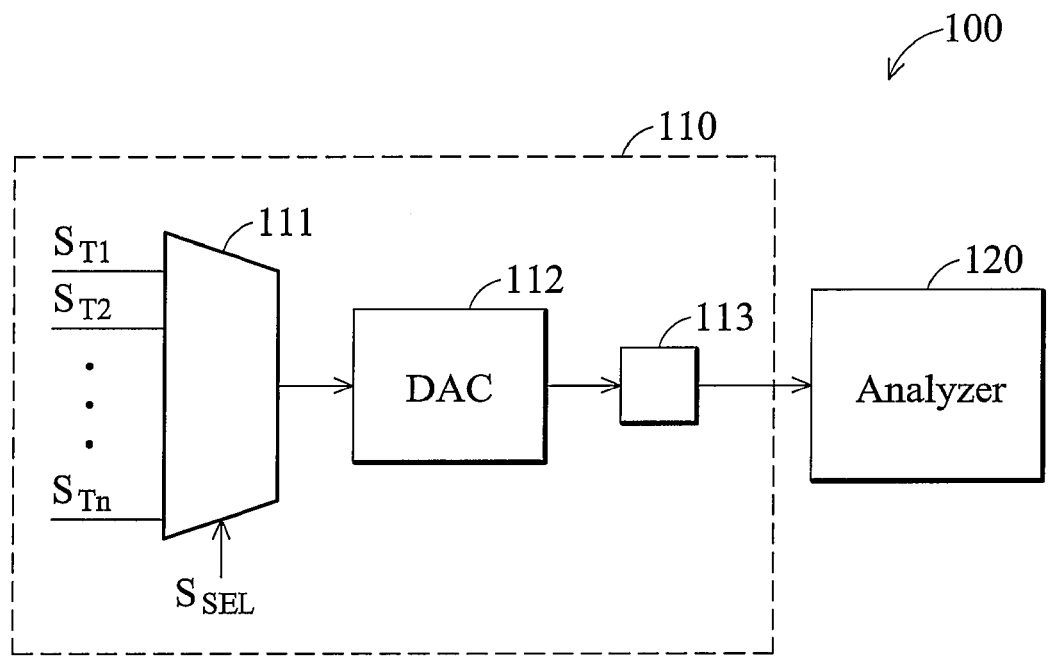
FIG. 1 is a conventional testing system.
Figure 2:
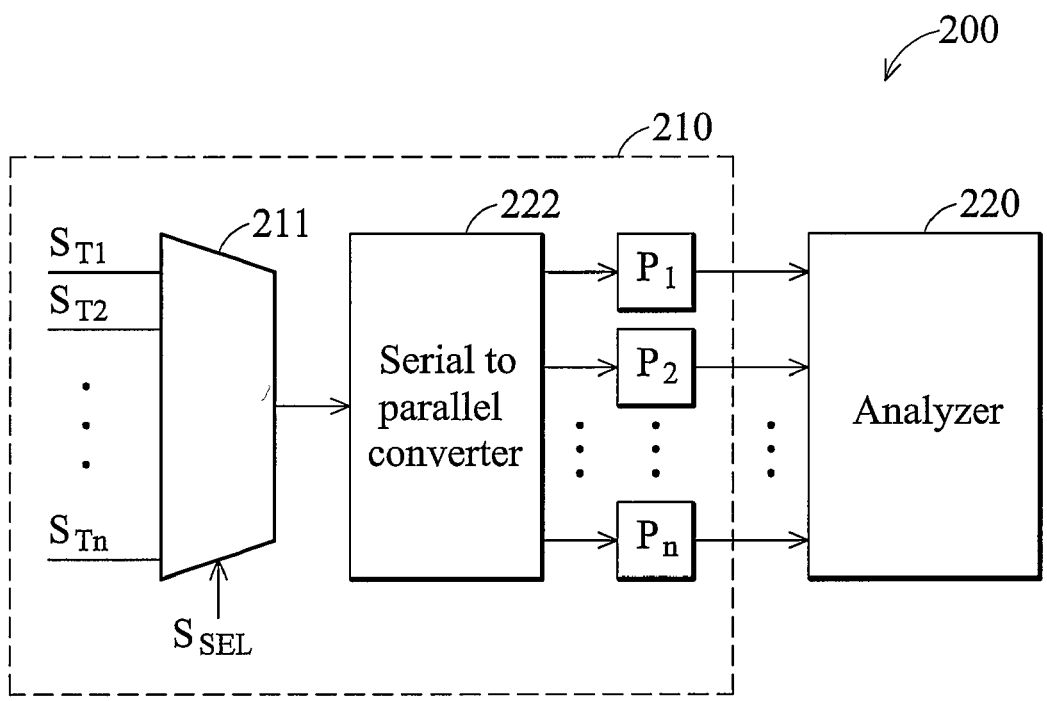
FIG. 2 is another conventional testing system.

Processing module 312 outputs processing signal $S_P$ according to target signal $S_T$. Throughput of target signal $S_T$ exceeds that of processing signal $S_P$. Because the throughput of target signal $S_T$ is reduced by processing module 311, analyzer 320 can read target signal $S_T$ when it is a high-speed signal. Comparing with the testing system 200 shown in FIG. 2, pads $P_1 \sim P_n$ are required to transmit high-speed signals. In the testing system 200, the serial to parallel converter 222 transforms one of the target signals $S_{T1} \sim S_{Tn}$ to generate a plurality of parallel signals and then transmits the parallel signals to the analyzer 220 via pads $P_1 \sim P_n$. The analyzer 220 utilizes the parallel signals to obtain the original target signal. Therefore, the parallel signals need to be re-organized to obtain the original signal, and a synchronization issue occurs among pads $P_1 \sim P_n$.

However, the system 300 does not require a large number of pads to transmit high-speed signals. In the system 300, the processing module 312 reduces the throughput of target signal $S_T$ to generate the processing signal $S_P$. Since the throughput of the processing signal $S_P$ is lower, analyzer 320 can read target signal $S_T$ from the processing signal $S_P$. Thus, the system 300 does not require a large number of pads to transmit high-speed signals. In some embodiments, processing module 312 is a memory or a processor. Therefore, analyzer 320 determines whether the pulse generating module 311 is abnormal according to processing signal $S_P$ generated by processing module 312.

When processing module 312 is a memory, target signal $S_T$ is directly stored in the memory. The memory provides the stored target signal $S_T$ to serve as processing signal $S_P$. When the memory reaches full capacity, the memory stops storing data and begins outputting stored data. In some embodiments, the memory simultaneously stores and outputs data, wherein the storage speed exceeds the output speed.

When processing module 312 is a processor, the processor executes a lossless compression (Huffman coding, arithmetic coding), a lossy compression (differential pulse code modulation, transform coding), or a down-sample operation for target signal $S_T$. Throughput of target signal $S_T$ processed by the lossy compression operation is less than throughput of target signal $S_T$ processed by the lossless compression operation. If target signal $S_T$ is processed by the lossless compression or the lossy compression operation, analyzer 320 executes a corresponding decompression operation for processing signal $S_P$. For example, if target signal $S_T$ is processed by the lossless compression and analyzer 320 executes a corresponding decompression operation, it is no distortion between the decompression result and the target signal $S_T$. If target signal $S_T$ is processed by the lossy compression and analyzer 320 executes a corresponding decompression operation, distortion is generated between the decompression result and the target signal $S_T$. Additionally, if target signal $S_T$ is processed by the down-sample operation, the throughput of the processed signal and the processing time can be reduce because the sample amount is reduced for target signal $S_T$.

Moreover, the processing module 312 can also be a processor plus a memory (could be shown by FIG. 5), where in the memory is used to store the processed signals from the processor. Because the input port of memory usually have bandwidth limit, thus after reducing the throughput of the target signal $S_T$ by the processor, the processed signal can be stored to the memory easier. The memory is arranged to output the processed data when full stored.

Figure 4:
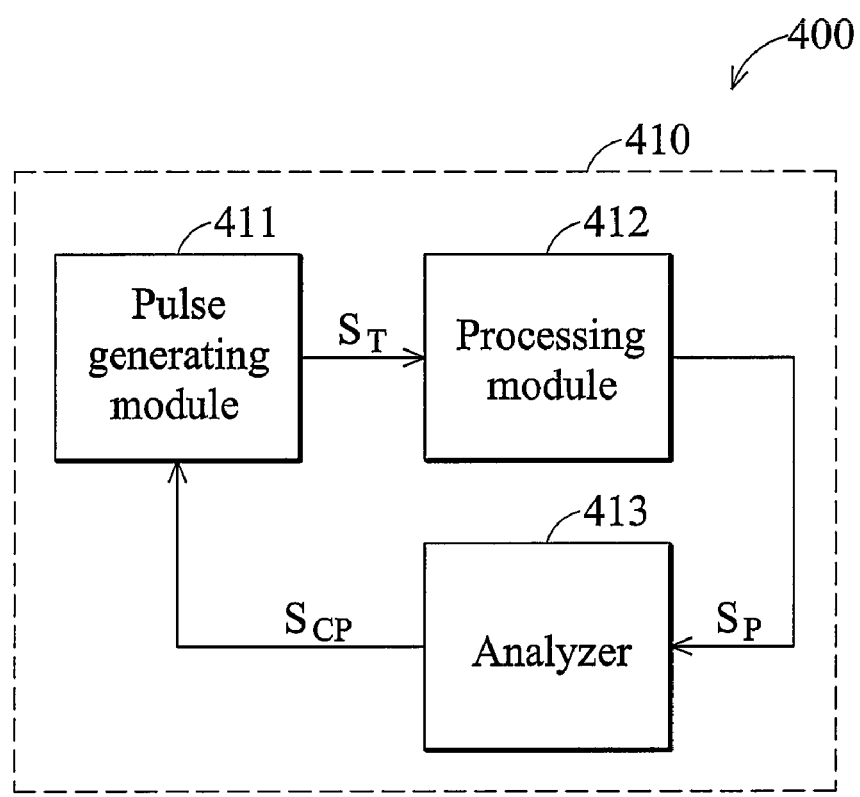
FIG. 4 is a schematic diagram of another exemplary embodiment of a system.

FIG. 4 is a schematic diagram of another exemplary embodiment of a system. FIG. 4 is similar to FIG. 3 with the exception that an analyzer 413 is integrated into a chip 410 with a pulse generating module 411 and a processing module 412 together. Because pulse generating modules 311 and 411 have the same principle and processing modules 312 and 412 have the same principle, descriptions of pulse generating module 411 and processing module 412 are omitted.

Analyzer 413 generates a control parameter $S_{CP}$, such as a signal to noise ratio (SNR), according to processing signal $S_P$. The control parameter $S_{CP}$ corrects pulse generating module 411 for generating an accurate target signal $S_T$ or is utilized to determine whether the chip 410 is abnormal or control the pulse generating module 411 for adjusting.

Figure 5:
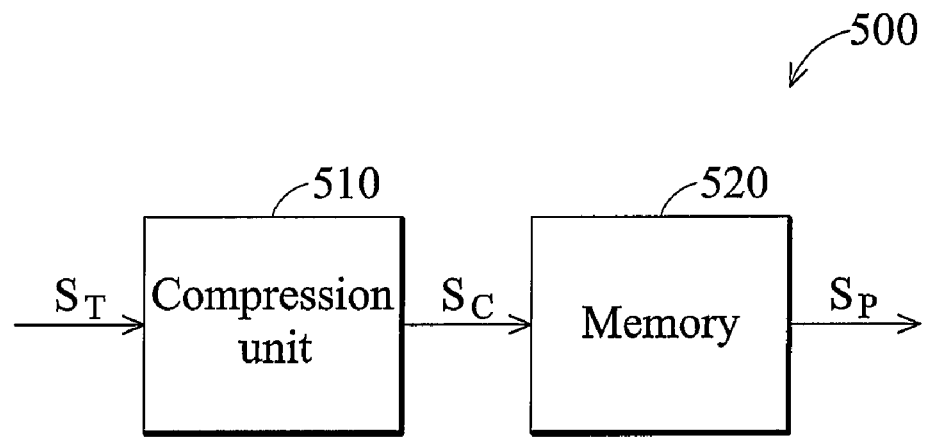
FIG. 5 is a schematic diagram of an exemplary embodiment of a processing module.

FIG. 5 is a schematic diagram of an exemplary embodiment of a processing module. A processing module 500 comprises a compression unit 510 and a memory 520. Compression unit 510 executes a lossless compression or a lossy compression operation for target signal $S_T$ such that a transforming signal $S_C$ is generated.

Memory 520 stores transforming signal $S_C$ and outputs the stored transforming signal to serve as processing signal $S_P$. In some embodiments, a serial to parallel converter replaces memory 520, transforming signal $S_C$ is thus converted from serial to parallel.

Figure 6:
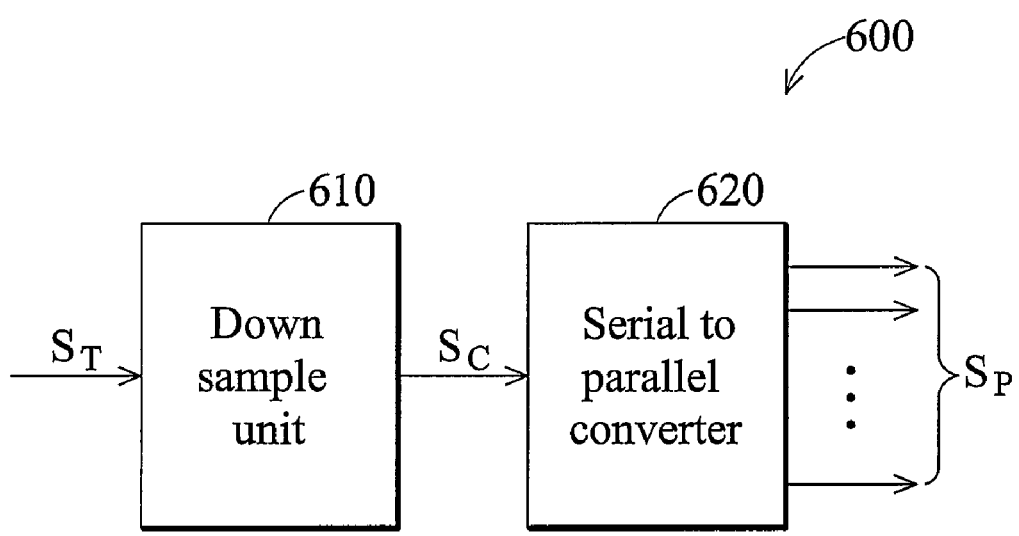
FIG. 6 is a schematic diagram of another exemplary embodiment of the processing module.

FIG. 6 is a schematic diagram of another exemplary embodiment of the processing module. Processing module 600 comprises a down-sample unit 610 and a serial to parallel converter 620. Down-sample unit 610 executes a down-sample operation for target signal $S_T$ to generate a transforming signal $S_C$.

Serial to parallel converter 620 converts transforming signal $S_C$ from a serial state to a parallel state such that processing signal $S_P$ is generated. Processing signal $S_P$ is output to an analyzer through a plurality of pads. In some embodiments, serial to parallel converter 620 is replaced by a memory for storing transforming signal $S_C$. Throughput of target signal $S_C$ is reduced by down-sample unit 610, thus, transforming signal $S_C$ does not exceed the maximum memory bandwidth.

Figure 7:
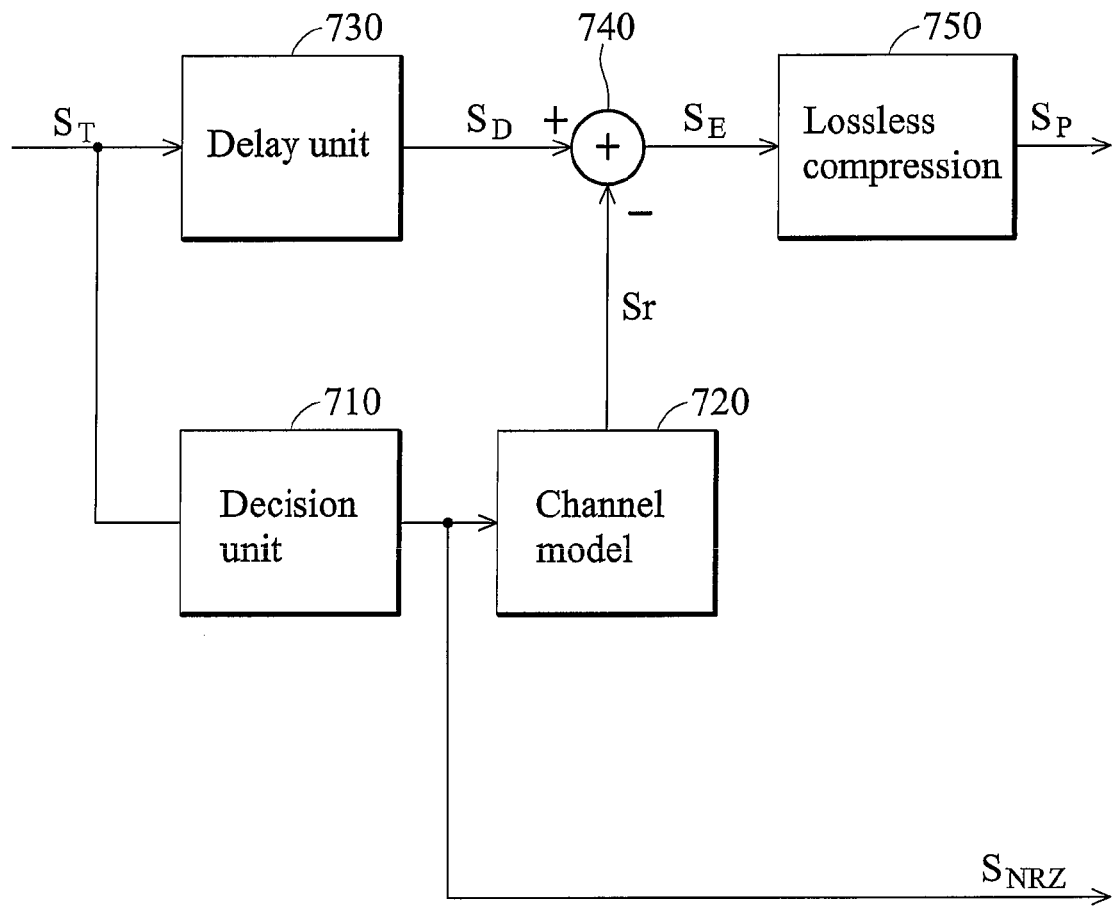
FIG. 7 is a schematic diagram of another exemplary embodiment of a compression.

FIG. 7 is a schematic diagram of another exemplary embodiment of a compression. A decision unit 710 processes a target signal $S_T$ (high frequency signal) provided by a disc to generate a NRZ (Non-Return to Zero) signal $S_{NRZ}$. The NRZ signal $S_{NRZ}$ has one bit. A channel model 720 processes the NRZ signal $S_{NRZ}$ to obtain a roughing signal Sr. A delay unit 730 delays the target signal $S_T$ to generate a delay signal $S_D$. The difference between the roughing signal Sr and the target signal $S_T$ is smaller. A calculator adder 740 processes the roughing signal Sr and the delay signal $S_D$ to obtain a difference signal $S_E$. A lossless compression 750 processes the difference signal $S_E$ to reduce throughput of the difference signal $S_E$ and to generate the processing signal $S_P$. It is noted that the processing signal $S_P$ and the NRZ signal $S_{NRZ}$ are compressed signal with lower throughput.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip, comprising:
   a pulse generating module generating a target signal; and
   a compression unit compressing the target signal to generate a transforming signal, wherein throughput of the target signal exceeds throughput of the transforming signal.

2. The chip as claimed in claim 1, wherein the target signal is a radio frequency (RF) signal.

3. The chip as claimed in claim 1, further comprises a memory storing the transforming signal and outputting the stored transforming signal to serve as a processing signal.

4. The chip as claimed in claim 1, wherein the pulse generating module comprises an analog to digital converter (ADC) for generating the target signal.

5. A system, comprising:
   a pulse generating module generating a target signal; and
   a processing module outputting a processing signal according to the target signal, wherein throughput of the target signal exceeds throughput of the processing signal.

6. The system as claimed in claim 5, wherein the target signal is a radio frequency (RF) signal.

7. The system as claimed in claim 5, wherein the target signal is unprocessed by a de-modulation module.

8. The system as claimed in claim 5, wherein the pulse generating module comprises an analog to digital converter (ADC) for generating the target signal.

9. The system as claimed in claim 5, further comprising an analyzer determining whether the pulse generating module is abnormal according to the processing signal.

10. The system as claimed in claim 5, wherein the processing module is a memory storing the target signal.

11. The system as claimed in claim 10, wherein the memory outputs the stored target signal to serve as the processing signal.

12. The system as claimed in claim 5, wherein the processing module comprises:
    a processor reducing the throughput of the target signal to generate a transforming signal; and a memory storing the transforming signal and outputting the stored transforming signal to serve as the processing signal.

13. The system as claimed in claim 12, wherein the target signal is compressed by the processor.

14. The system as claimed in claim 12, wherein the target signal is sampled by the processor.

15. The system as claimed in claim 5, wherein the processing module processes the target signal for reducing the throughput of the target signal.

16. The system as claimed in claim 5, wherein the processing signal is output to an analyzer, and the analyzer calculates the processing signal to generate a control parameter.

17. The system as claimed in claim 16, wherein the analyzer, the pulse generating module, and the processing module are integrated into a chip and the analyzer utilizes the control parameter to control the pulse generating module.

18. The system as claimed in claim 16, wherein the pulse generating module and the processing module are integrated into a chip and the analyzer is not integrated into the chip.

19. The system as claimed in claim 18, wherein the control parameter is a signal to noise ratio (SNR).

20. The system as claimed in claim 16, wherein the pulse generating module and the processing module are integrated into a chip, and the analyzer receives the processing signal outside of the chip.

* * * * *